United States Patent
Gaynor

(10) Patent No.: US 6,329,062 B1
(45) Date of Patent: Dec. 11, 2001

(54) DIELECTRIC LAYER INCLUDING SILICALITE CRYSTALS AND BINDER AND METHOD FOR PRODUCING SAME FOR MICROELECTRONIC CIRCUITS

(75) Inventor: Justin F. Gaynor, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/514,966

(22) Filed: Feb. 29, 2000

(51) Int. Cl.$^7$ ............................. B05D 5/12; B32B 27/20

(52) U.S. Cl. ..................... 428/447; 524/847; 524/588; 524/858; 524/859; 428/450; 423/335; 427/387; 427/397.7

(58) Field of Search .................... 524/847, 588, 524/858, 859; 428/447, 450; 423/555; 427/387, 397.7

(56) References Cited

U.S. PATENT DOCUMENTS

| | | | |
|---|---|---|---|
| 4,061,724 | 12/1977 | Grose et al. | 423/335 |
| 4,073,865 | 2/1978 | Flanigen et al. | 423/339 |
| 4,401,555 | * 8/1983 | Miller . | |
| 4,652,467 | 3/1987 | Brinker et al. | 427/246 |
| 4,699,892 | 10/1987 | Suzuki | 502/4 |
| 4,849,284 | 7/1989 | Arthur et al. | 428/325 |
| 4,865,875 | 9/1989 | Kellerman | 427/96 |
| 4,987,101 | 1/1991 | Kaanta et al. | 437/228 |
| 4,994,302 | 2/1991 | Kellerman | 427/96 |
| 5,019,263 | 5/1991 | Haag et al. | 210/500 |
| 5,103,288 | 4/1992 | Sakamoto et al. | 357/71 |
| 5,149,590 | 9/1992 | Arthur et al. | 428/447 |
| 5,157,005 | * 10/1992 | Suppiah . | |
| 5,260,243 | * 11/1993 | Dunne et al. . | |
| 5,354,611 | 10/1994 | Arthur et al. | 428/325 |
| 5,470,802 | 11/1995 | Gnade et al. | 437/238 |
| 5,494,858 | 2/1996 | Gnade et al. | 437/231 |
| 5,494,859 | 2/1996 | Kapoor | 437/235 |
| 5,504,042 | 4/1996 | Cho et al. | 437/247 |
| 5,523,615 | 6/1996 | Cho et al. | 257/632 |
| 5,561,318 | 10/1996 | Gnade et al. | 257/638 |
| 5,744,035 | 4/1998 | Geus et al. | 210/490 |
| 5,779,904 | 7/1998 | Ruderman et al. | 210/500.25 |
| 5,780,163 | * 7/1998 | Camilletti et al. . | |
| 5,801,092 | 9/1998 | Ayers | 438/623 |
| 5,863,516 | 1/1999 | Otterstedt et al. | 423/100 |
| 5,942,650 | * 8/1999 | Gajda . | |

FOREIGN PATENT DOCUMENTS

59213739 * 12/1984 (JP) .

OTHER PUBLICATIONS

Kroschwitz, Encyclopedia of Chemical Technology, 4th Ed., vl. 21, Wiley–Interscience, pp. 105–1023 (1997).*
Brinker, "Structural Evolution during Consolidation", Sol–Gen Science: Processing., Chapter 9, Academic Press, 3 pages (1990).
Tsaptsis, et al., "Synthesis of Porous Inorganic Membranes", MRS Bulletin, pp. 30–35, (1999).
Gies, "Cystalline Porous Silicas: Template directed Synthesis of Microporous Tetrahedral Networks", Institiut für Mineralogie, Chapter 16, pp. 213, 215 and 221.
Persson, et al.., "The synthesis of discrete colloidal particles of TPA–silicalite–1", Zeolites, 1994, vol. 14, Sep./Oct. (1994).
Mintova, et al., "Mechanism of Zeolite A nanocrystal Growth From Colloids at Room Temperature", Science, vol. 283, pp. 958–960 (Feb. 12, 1999).
Hedlund, et al., "Controlling the preferred orientation in silicalite–1 films synthesized by seeding", Microporous and Mesoporous Materials 28, pp. 185–194, (1999).
Tsapatsis, et al., "Synthesis and Structure of Ultrafine Zeolite KL (LTL) Crystalites and their Use for Thin Film Zeolite Processing", Mat. Res. Soc. Symp. Proc. vol. 371, pp. 21–26 (1995).
Sterte, et al., "Thin Molecular sieve films on noble metal substrates", Elsevier Science Inc., pp. 387–390, (1997).
Flanigen, et al., "Silicalite a new hydrophobic cyrstalline silica molecular sieve", Nature, vol. 271, pp. 512–516 (Feb. 9, 1978).
Mintova, et al., "Growth of silicalite–1 films on gold substrates", Microporous Materials, vol. 11, pp. 149–160, Apr. 14, 1997 (1997).
Bibby, "Synthesis of silica–sodalite from non–aqueous systems", Nature, vol. 317, pp. 157–158, (Sep. 12, 1985).
Binder, et al., "Three–Dimensional Ordering of Molecules: δ–Nitroaniline in aligned ZSM–5 Single Crystals", The Journal of Physical Chemistry B, vol. 101, No. 4, pp. 483–490, (1997).
Marler, "Silica–ZSM–22: synthesis and single crystal structure refinement", Zeolites, vol. 7, pp. 393–397, Sep. 1987.
Fyfe, et al., "Detailed Investigation of the Lattice Structure of Zeolite ZSM–11 by a Combination of Solid–State NMR and Synchrotron X–ray Diffraction Techniques", J. Am. Chem Soc., pp. 2470–2474, vol. 111, (1989).

(List continued on next page.)

*Primary Examiner*—Robert Dawson
*Assistant Examiner*—Kuo-Liang Peng
(74) *Attorney, Agent, or Firm*—Skjerven Morrill MacPheron LLP; George Wolken, Jr.

(57) ABSTRACT

A two-component porous material including small silicalite crystals in a porous binder provides a low dielectric constant material useful as an insulating layer in microelectronic devices. The silicalite/binder porous material uses silicalite nanocrystals smaller than the characteristic dimensions of the features on the integrated circuit device. The binder is an amorphous porous material that links the silicalite nanocrystals together, formed from a precursor which polymerizes on heating. The silicalite nanocrystals are supplied as a colloidal suspension or slurry. The slurry and binder precursor are spincoated onto a substrate and thermally treated to polymerize the binder precursor and drive off solvent in the slurry, forming the porous silicalite/binder material. The silicalite/binder porous material is readily integrated into standard damascene fabrication processes.

19 Claims, 6 Drawing Sheets

OTHER PUBLICATIONS

Fyfe, et al., "Cystal Structure of Silica–ZSM–12 by the Combined Use of High–Resolution Solid–State MAS NMR Spectroscopy and Synchrotron X–ray Powder Diffraction", J. Am. Chem Soc., pp. 3718–3721, vol. 94, (1990).

Bialek, et al., "The synthesis and structure of SSZ–24, the silica analog of $AlPO_4$–5", Zeolites, vol. 11, pp. 438–442, Jun. 1991.

Binder, et al., "Photoluminescence of three–dimesionally oriented p–nitroaniline molecules in aligned zeolites", Journal of Luminescence, pp. 470–472, (1997).

Scandella, et al., "Combination of single crystal zeolites and microfabrication: Two applications towards zeolite nanodevices", Microporous and Mesoporous Materials, vol. 21, pp. 403–409, (1998).

Scandella, et al., "Alignment of Single–Crystal Zeolites by Means of Microstructured Surfaces", Advanced Materials, vol. 8, No. 2, 137–139 (1996).

Cheetham, et al., "Open–Framework Inorganic Materials", Angew. Chem. Int. Ed. 38, pp. 3269–3272, (1999).

* cited by examiner ic circuits
DIELECTRIC LAYER INCLUDING SILICALITE CRYSTALS AND BINDER AND METHOD FOR PRODUCING SAME FOR MICROELECTRONIC CIRCUITS

TECHNICAL FIELD

This invention relates generally to the fabrication of dielectric layers on semiconductor devices, and more specifically to methods for forming dielectric layers from small silicalite crystals bound together with a binder to produce a low dielectric constant material and to the composition formed thereby.

BACKGROUND

Microelectronic integrated circuits based on patterned semiconductor materials are continuing to evolve towards devices with an extremely high density of circuit elements per unit volume. As the features of these devices are reduced to smaller sizes, the performance of the materials that constitute the device will critically determine their success. One specific area in need of advancement is the electrical insulator used between the wires, metal lines, and other elements of the circuit. As the distances between the circuit elements become smaller, there will be increased problems due to capacitive coupling (crosstalk) and propagation delay. These difficulties can be avoided by preparing the circuit using an insulating material that possesses a dielectric constant as low as possible. It has been conventional to use dense materials such as silicon dioxide, silicon nitride, and cured silsesquioxanes as insulators. However, the dielectric constants of these materials range from 3.0–7.0 which will not be adequate for future circuits. The speed at which future circuits will operate will be limited by RC delay in the interconnect. As yet the only fully dense materials with a dielectric constant less than about 2.4 are fluorinated polymers or fully aliphatic hydrocarbon polymers, but these have not met requirements for adhesion and thermal stability.

Thus, considerable effort has been focused towards the development of porous dielectric materials. These can be thought of as composite materials, with the value of their dielectric constants intermediate between that of air and the fully dense phase. Several classes of dielectric films, including porous oxides, polymers, and porous polymers have been described in the patent and open literature. While most polymers are inherently lower in dielectric constant than silicon dioxide-based films, the long history of silicon dioxide in integrated circuits favors their use. Many of the subsequent processing steps in IC fabrication, including patterning, etching, photoresist removal, cleaning and chemical mechanical polishing, have been developed and proven for silicon dioxide, so porous silicon dioxide films are potentially more easily integrated into existing production schemes. New processes for etching, photoresist removal, cleaning and polishing will need to be developed and proven before polymer films will become an attractive alternative to silicon dioxide.

U.S. Pat. No. 4,987,101, issued to Kaanta, et al. on Jan. 22, 1992 describes a process to prepare fully porous (air gap) structures by depositing a removable material in the critical area of the device, applying a solid cap to this material, and removing the temporary filler through holes bored in the cap. This requires several difficult process steps to completely eliminate all material from the desired areas. Additionally, there would be no mechanical support provided by the air gap. This could lead to deformations of the circuit as the device is cycled through high temperatures in subsequent processing steps.

A common approach taken to achieve porous films on semiconductor wafers draws upon the methods of sol-gel chemistry to produce porous xerogels. These methods typically employ the hydrolysis and condensation reaction of metal or metalloid alkoxides to form a gel containing a continuous solid phase of the corresponding metal or metalloid oxide. The gel is filled with the solvent and other liquid reactants used in the process that must be removed to achieve a porous solid matrix. The sol-gel process produces porous materials with fine particle sizes (2–10 nm) and very high porosities (70–99%). U.S. Pat. No. 4,652,467 to Brinker et al. describes preparing such a gel of silicon oxide. The gel is then dried by evaporative methods yielding a film of pure silicon dioxide. However, there is significant shrinkage resulting from the further condensation reaction of the silica particles as the gel structure is drawn together by the surface tension of the evaporating liquids. This leads to high density films (relative to the as-deposited material, but not necessarily relative to fully dense oxide) and increases their dielectric constant.

A method to avoid the problem of gel shrinkage during drying, developed by Gnade, et al, and Cho, et al. and described in U.S. Pat. Nos. 5,470,802, 5,494,858, 5,504,042, and 5,561,318 involves a further chemical derivatization of the silicon dioxide surface with an unreactive organic group. The chemical derivatization prevents condensation reactions as the gels shrink, and allows low density materials to be prepared by evaporative drying. These sol-gel processes require several chemical reactions to be performed after the alkoxide precursor solution has been applied to the wafer, which leads to difficulties of reproducibility and low throughput. Additionally, as the dielectric constant of porous silicon dioxide varies linearly with porosity (from 3.9 at full density, to 1.0 at full porosity) a very high porosity will be needed to achieve dielectric constants less than 2.0. This fact, and the random nature of the gelation process, increase the likelihood of encountering extremely large pores that would be detrimental to circuit fabrication. Several reports have been published by integrated circuit manufacturers which demonstrated successful integration of xerogel films, but the overall dielectric constant of these layers was much higher than 2.0 and it is not clear that these successes can be made economically attractive for large-scale manufacturing.

Thus, there remains a need for a low dielectric constant material with moderate to high porosity, in which pore size is better controlled than the random pores formed in xerogels. Additionally, there is a need for a dielectric material that can be easily deposited on semiconductor wafers with standard wafer processing techniques, and which can withstand the subsequent etch, polish, and metallization steps. It would further be desirable if the dielectric material had better mechanical properties than the porous materials that have been developed to date.

SUMMARY

A two-component porous material including small silicalite crystals in a porous binder provides a low dielectric constant material useful as an insulating layer in microelectronic devices. Silicalites are microporous crystalline oxides of silicon that are pure-silicon analogs of zeolites. The silicalite/binder porous material uses silicalite nanocrystals that are smaller than the characteristic dimensions of the features on the integrated circuit device. The individual silicalite crystals should be no larger than about 20% of the critical dimension of the smallest feature on the chip and a statistically insignificant number of the crystals should have a long axis greater than about 40% of the critical dimension.

The binder is a porous material that links the silicalite nanocrystals together. The binder is formed from a binder precursor material, which, on heating, polymerizes or crosslinks. Examples of useful binder precursors include tetraethoxysilane (TEOS), tetramethoxysilane (TMOS), methylsilsesquioxane, hydridosilsesquioxane, and organic polymers such as poly(arylene ethers) and benzocyclobutenes. The binder material may be a porous amorphous silica. The silicalite/binder porous material can have a dielectric constant less than about 2.6 and a porosity of about 50% or higher.

In the method of making the two component silicalite/binder porous material, the silicate nanocrystals are supplied as a colloidal suspension or slurry in a liquid medium. In one approach, the binder precursor is added directly to the silicalite slurry and the resulting solution is spin coated onto a semiconductor substrate. The amount of binder precursor in the solution is limited to less than about 5% by volume. The slurry is spincoated onto a substrate and treated by a high temperature bake and cure which polymerizes the binder precursor and drives off the solvent in the slurry, forming the porous silicalite/binder material. The limitation on the amount of binder precursor ensures the binder forms a porous amorphous solid. The presence of incompressible silicalite nanocrystals prevents the binder material from shrinking appreciably on drying. In alternative approaches the slurry and a binder precursor solution containing the binder precursor are deposited separately. The silicalite/binder porous material is readily integrated into standard semiconductor fabrication processes such as dual damascene processes and subtractive aluminum processes.

BRIEF DESCRIPTION OF THE DRAWINGS

Use of the same reference number in different figures denotes identical or similar elements.

DETAILED DESCRIPTION

Figure 1A:
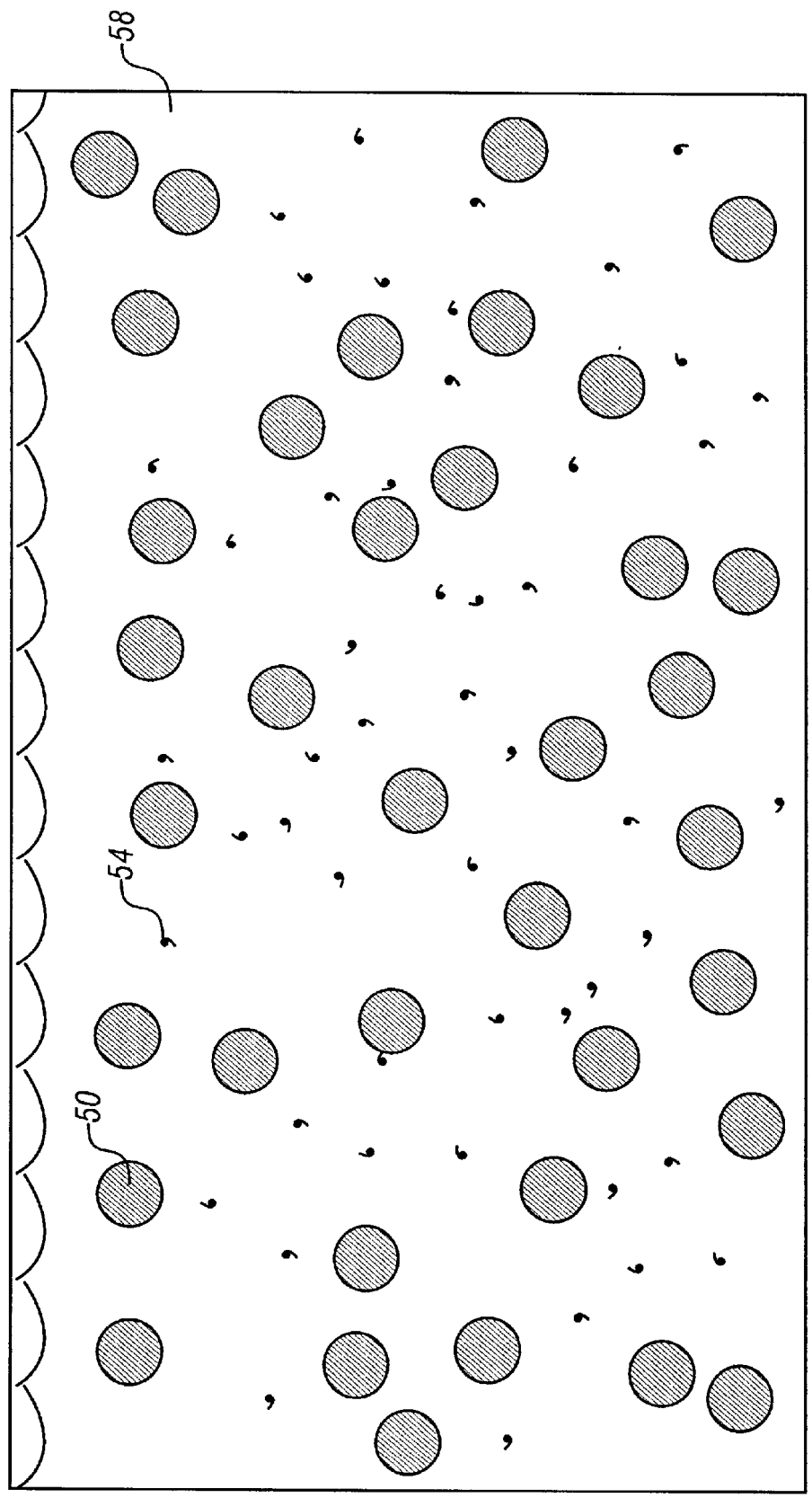
FIGS. 1a–1d schematically illustrate transformations during the formation of the silicalite/binder material, according to the present invention.
Figure 1B:
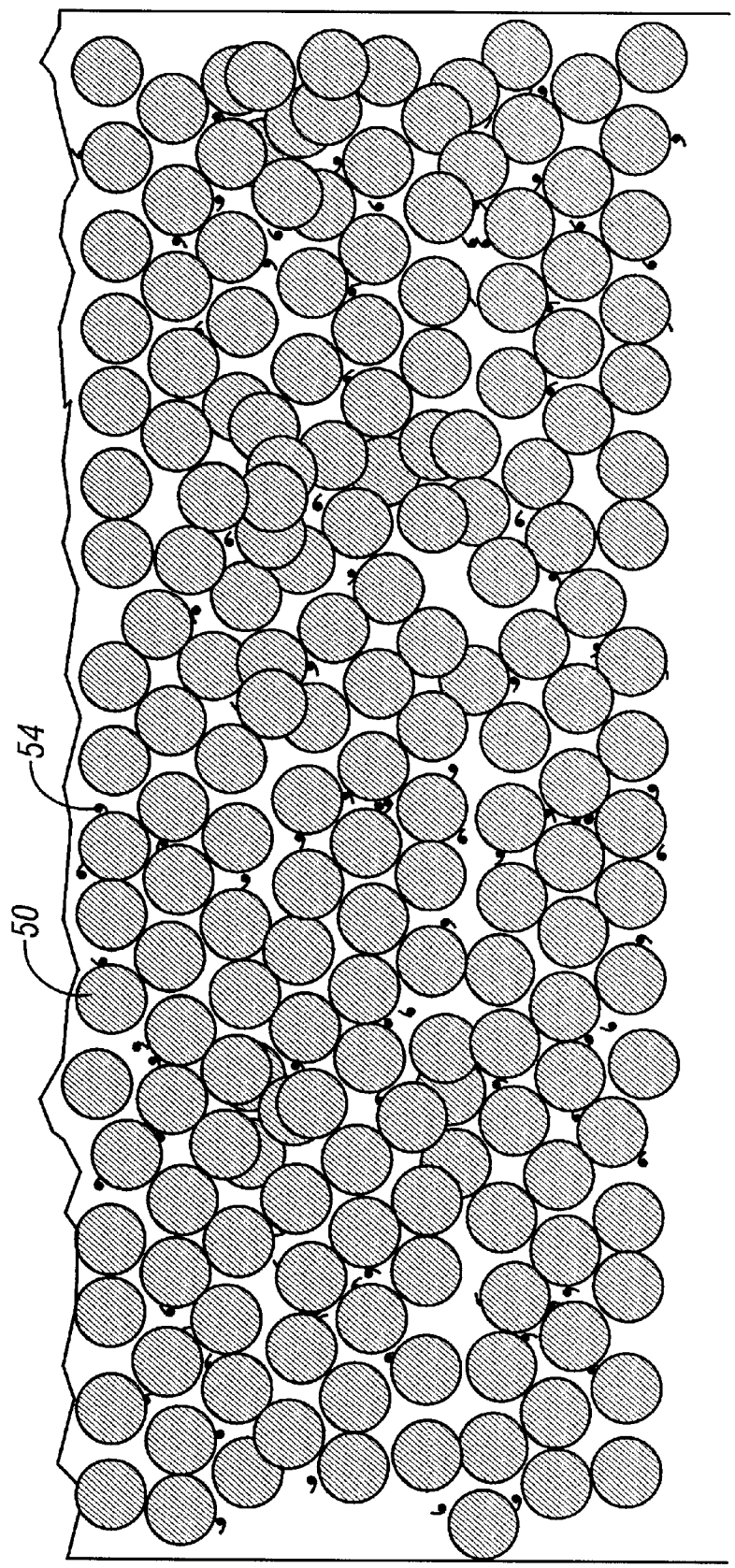

A two-component porous oxide material including small silicalite crystals, termed here nanocrystals, in a binder material provides a low dielectric constant material that may be used as an insulating layer in microelectronic devices.

Silicalite describes microporous crystalline oxides of silicon that are pure-silicon analogs of the well-known aluminosilicate zeolites. A number of silicalite crystal structures have been manufactured and identified using standard zeolite structure codes. The silicalites are true crystals, giving rise to characteristic x-ray powder diffraction patterns. However, the diffraction patterns are not always clear for nanocrystals, and so other methods, such as FTIR, have been used to show the existence of a particular crystal structure. Silicalite crystal structures useful according to the present invention include, but are not limited, to RUB-3, structure type RTH, framework density 17.3; Silica-sodalite, structure type SOD, framework density 17.4; Silica-SSZ-24, structure type AFI, framework density 17.5; Decadodecasil 3R, structure type DDR, framework density 17.6; Decadodecasil 3H, framework density 17.6; Octadecasil, structure type AST, framework density 17.6; Sigma-2, structure type SGT, framework density 17.8; Silica-ZSM-5 (silicalite), structure type MFI, framework density 17.9; Silica-ZSM-11 (silicalite-2), structure type MEL, framework density 17.9; Dodecasil 1H, structure type DOH, framework density 18.4; Dodecasil 3C, structure type MTN, framework density 18.6; Melanophlogite, structure type MEP, framework density 19.0; Nonasil, structure type NON, framework density 19.3; Silica-ZSM-12, structure type MTW, framework density 19.4; Silica-theta-1, structure type TON, framework density 19.7; and Silica-ZSM-48, framework density 19.9, where the framework density is defined as the number of tetrahedral atoms per 1000 Å$^3$. For comparison, crystalline quartz has a framework density of 26.5 and a density of 2.649 g/cm$^3$. The silicalite crystal structures listed have densities ranging from 1.76 to 1.97 g/cm$^3$, which suggest they have internal porosities in the range of 25% to 33%.

The two-component porous oxide material uses silicalite nanocrystals that are smaller then the characteristic dimensions of the features on the integrated circuit device. The individual silicalite crystals should be no longer than about 20% of the critical dimension of the smallest feature on the chip. Additionally, a negligible number of crystals should have a long axis greater than about 40% of the minimum critical dimension, where critical dimension, as conventionally defined in the semiconductor industry, is the width of a patterned line or the distance between two lines, monitored to maintain device performance consistency. For example, if metal lines 1000 Å wide and spaced 1000 Å apart are being formed the size of the silicalite crystals should average less than about 200 Å along the longest axis, with a statistically insignificant percentage of them longer than about 400 Å along their longest axis. A negligible number, or alternatively, a statistically insignificant percentage, are conventionally understood to mean a number, or percentage, that is so small that it has no effect on the observed behavior of the material. Otherwise, there are no restrictions on the crystal size or crystal size distribution. The crystals may be indicidual crystals or the crystals may be twinned or otherwise interpenetrating crystal masses, as long as each particle obeys the size restrictions listed above. Finally, any crystal structure of silicalite which is both less dense than quartz and thermally stable at temperatures above 500° C., i.e. which does not undergo crystal transformations at these temperatures, may be used. The silicalite particles are substantially hydrophobic both at room temperature and up to 500° C., have greater modulus and hardness than amorphous silica and a smaller dielectric constant than amorphous silica.

The second component of the two-component porous oxide material is a binder material that links, or "glues" together the silicalite nanocrystals to form the porous dielectric material. For example, the binder may be formed from a silicon-containing resin such as methylsilsesquioxane or hydridosilsesquioxane, or may be derived from tetraethoxysilane (TEOS) or tetramethoxysilane (TMOS). Alternatively, the binder may be formed from an organic species such as a poly(arylene ether) polymer or from benzocyclobutene polymer. Typically, the binder precursor is a material which, on heating, polymerizes and/or crosslinks with itself or with any terminal hydroxyl or other surface groups on the silicalite crystals to form an amorphous material which holds the silicalite crystals together. When TEOS, TMOS, or hydridosilsesquioxane is used as the binder precursor, the binder is characterized as an amorphous silica material. However, the possibility that TEOS or TMOS precursors may result in crystallization onto the silicalite nanocrystals to some extent cannot be excluded. Methylsilsesquioxane is converted on heating to a siloxane polymer and the organic binder precursors are converted to organic polymers.

The two-component silicalite/binder material is predicted to be a highly porous material. The theoretical upper density limit for packed spheres is the well-known hexagonal packing structure, which leaves 25.95% empty space between particles. Randomly-packed spheres, as described in this work, will be packed less perfectly and leave more empty space; both calculated and experimental values for random packing show about 35% empty space. However, silicalite crystals are not perfect spheres, and measurements of refractive index suggest they pack less efficiently than perfect spheres. Typically, the refractive index of spun silicalites show about 50% porosity. Combining the 50% density of packed particles with densities of 67% to 75% for each individual silicalite crystal suggests an overall density of about 33% to 37%, relative to quartz, or equivalently about 40% to 45% relative to amorphous silicon. The final density of the film will be slightly higher, due to the addition of a small percentage of binder. From these considerations, we expect the silicalite/binder material to have an overall porosity of at least about 50% and dielectric constants in the range of 2.2 to 2.6.

Key to the practice of the present invention is the availability of small, pure particles of silicalite. There has been significant interest in zeolite and silicalite materials because of their potential utility as catalysts, molecular sieves for separations, electrodes, sensors, and optoelectronic devices. One method of preparing silicalite is disclosed in U.S. Pat. No. 4,061,724 to Grose et al., which is incorporated, herein, by reference. The method involves the hydrothermal crystallization of a reaction mixture including water, a source of silica, and an alkylonium compound, such as tetraethylammonium hydroxide or tetrapropylammonium hydroxide (TPAOH), at a pH of 10 to 14. Synthesis of colloidal suspensions of discrete particles of colloidal zeolite from solutions containing aluminumsilicates and tetramethylammonium hydroxides is taught by U.S. Pat. No. 5,863,516 to Otterstedt et al., which is incorporated, herein, by reference. (See also, Mintova et al. Science 283, 958 (1999).) Preparation of a colloidal suspension of silicalite nanocrystals from hydrothermal treatment of a reaction mixture of TEOS, TPAOH, distilled water, and ethanol has been described by Persson et al., Zeolites 14, 557 (1994) and by Sterte et al. ibid, 18, 387 (1997). The reactants are mixed together and heat treated, typically between approximately 20° C. and 100° C. The size of the crystals can be tailored by the reaction time, reaction temperature and the alkalinity of the solution. Increasing the alkalinity of the reaction solution leads to a larger number of smaller crystals. Alternatively, synthesis schemes using commercially available colloidal silica or fumed silica have been described in the open literature.

In the method of making the two component silicalite/binder porous material, according to the present invention, the silicate nanocrystals are supplied as a colloidal suspension or, more generally, as a slurry in a liquid medium. A slurry may contain, in addition to the colloidal suspension, particles that are not in a true colloidal suspension. The silicalite nanocrystals are present in the slurry at a concentration of from about 5% to about 40% by weight. A typical silicalite concentration is about 20 weight %. In one approach, the binder precursor is added directly to the silicalite slurry and the resulting solution is spin coated onto a semiconductor substrate. The amount of binder precursor in the solution is limited to between about 0.5%–5% by volume. The binder precursor used in this approach must be stable, that is, minimally chemically reactive at typical storage temperatures, in the slurry solution. The binder precursor also needs to be soluble in the same solvent as the silicalite slurry.

A silicalite slurry prepared, as described above, using TPAOH is an alkaline solution. The ability of a pH>~8.5 solution to stabilize a silicalite colloidal suspension is well known, and is the easiest method of stabilizing it. In the case of an alkaline silicalite slurry, binder precursors stable in basic solution, for example, methylsilsesquioxane, or organic polymer resins, as described above, are used. However, many of the binders are highly reactive in the presence of base, and so other methods of stabilizing the colloidal suspension are used. For example, the silicalite nanocrystals can be dispersed in an organic solvent or mixture of organic solvents. The surface of the nanocrystals is optionally treated with an amine or other coating to prevent agglomeration in the organic solvent. Any binder precursor compatible with the organic solvent can be added to the silicalite/organic solvent slurry to form a coating solution that is spin coated onto a substrate. Ideally, the solvent mixture contains a low boiling point solvent, such as ethanol, and a high boiling point solvent, such methylisobutylketone (MIBK) and/or propyl propylene glycol (PPG). Those skilled in the art of spin coating arbitrarily distinguish low and high boiling point solvents as boiling below and above about 100° C., respectively.

The silicalite/binder coating solution is spin coated onto a substrate using industry standard equipment and methods. The dispense and thickness spin steps are followed by one or more soft bake steps at temperatures between about 100° C. and about 200° C. for a total time of less than about 10 minutes, which serves to drive off the solvent in the coating solution. A high temperature cure, on a hot plate or in a furnace, at temperatures between about 350° C. and 450° C. for about 5 minutes to an hour following the soft bake, depending on the binder, completes the conversion of the binder precursor to an amorphous solid. Optionally, a layer of binder solution is applied to the substrate before the silicalite/binder coating solution is applied to promote binding of the silicalite particles to the substrate.

Figure 1D:
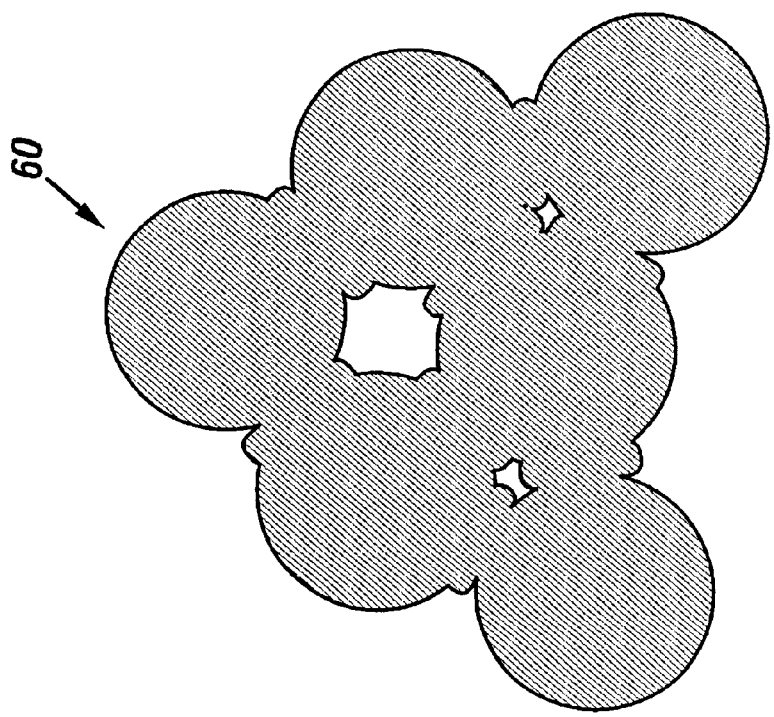
Figure 1C:
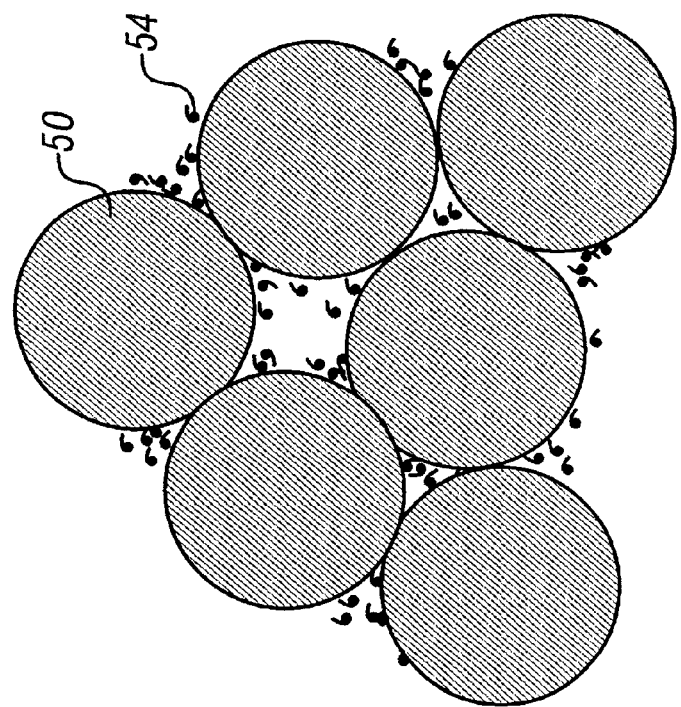

The changes to the silicalite/binder during the process steps just described are shown schematically in FIGS. 1a–1d. In FIG. 1a, the silicalite particles 50 and binder molecules 54 are shown as non-reactive in solution 58. The term non-reactive means they do not react at an appreciable rate under standard storage conditions, which may include refrigeration. After spinning, FIG. 1b, the low boiling point solvent and much of the high boiling point solvent is removed, leaving a solvated film of particles plus binder. After heating at about 200° C., FIG. 1c, the remainder of the solvent is driven off and the binder molecules form a coating around each particle. It is also possible that initial crosslinking or polymerization of the binder will occur during this step. The volume occupied by the solvents will remain behind, as air, after the solvent evaporates, limiting the amount of crystal-to-crystal space that can be filled by the binder. In FIG. 1d, after the high temperature cure, the binder has completely reacted to form the porous silicalite/binder material 60.

The present process thus produces a porous material consisting of silicalite nanocrystals, which are themselves porous, linked by an amorphous solid. The silicalite nanocrystals constitute the major component of the silicalite/binder porous material. A porous material in which the silicalite crystals constitute at least about 90% by weight of the total material is advantageous. Further, the presence of incompressible nanocrystals prevents the binder material from shrinking appreciably on drying.

As described in Example 1 below, the process has been demonstrated with TEOS as the binder precursor and using a colloidal suspension of amorphous silica particles in place of a silicalite slurry, which we term here "pseudosilicalite". The amorphous silica particles are neither perfectly spherical nor perfectly uniform in size, leading to higher porosity than predicted for an ideal system. In this example, hydrolyzed TEOS in ethanol, with a trace of acidic water, constituted the binder solution. Solutions of 2.5% to 10% binder solution in the slurry were used. In addition, control samples were fabricated without any binder. The slurry was a colloidal suspension of 200 Å silica particles in ethanol and propyl propylene glycol, and was substantially nonalkaline, with a pH between 7 and 8. These particle/binder solutions were spin-coated, baked, and cured according to standard industry practice.

As summarized in Table 1 below, the "pseudosilicalite/binder" materials of this example exhibited refractive indices substantially reduced compared to the value of 1.43 of dense silicon dioxide, as a result of the empty space between particles. The refractive indices are also a strong function of the amount of binder solution added, again according to prediction. Additionally, the binder served to substantially increase the mechanical strength of the system.

In a second approach, the silicalite slurry and a binder solution consisting of a binder precursor in a solvent miscible with the solvent of the silicalite slurry are premixed immediately before spin coating, using the process described above, onto a substrate. In this approach, binder precursors that are somewhat reactive in the silicalite slurry at room temperature can be used.

In a third alternative, the silicalite slurry and the binder solution are deposited onto a substrate in separate applications. This approach is most useful if the binder is highly reactive towards the slurry and therefore has an impracticably short shelf life, or if the binder is to be introduced by gaseous infiltration rather than as a liquid. Any thermally activated precursor can be used in the binder solution in this alternative.

The properties of the silicalite/binder porous material can be estimated from the limiting cases of the "pseudosilicalite/binder" material described above and of a dense polycrystalline silicalite film, grown in situ from silicalite seed crystals as described, for example, in Sterte et al. supra. As described in Example 2 below, the dense polycrystalline silicalite film has a dielectric constant of 2.84 which provides an upper limit to the dielectric constant of the silicalite/binder material. Combining the dielectric constant value for the dense film with an observed porosity of the "pseudosilicalite/binder" material of Example 1 of from 32 to 44% gives a dielectric constant for the silicalite/binder porous material of about 2.15 to about 2.45. "Pseudosilicalite/binder" has a stud pull value of about 7–16 Mpa, and, when cured for 60 minutes, has a modulus of about 5 gPa, which provide severe lower limits to the properties of the silicalite/binder porous material. The crystal structure imparts significantly greater mechanical strength to the silicalite crystals as compared with amorphous silica particles. Hardness of silicalite crystals is demonstrated by the fact that silicalite crystals scratch glass.

The silicalite/binder porous material and method according to the present invention offers significant advantages for use as an insulating layer in integrated circuit devices over xerogel porous materials of the prior art and over dense polycrystalline silicalite films grown in situ. The silicalite crystals have no dangling bonds in the interior of the crystals, and thus are hydrophobic, in contrast to xerogels that are notoriously hydrophilic, leading to instability. However, these solution-grown nanocrystals will have hydrophilic functional groups on their exterior surfaces unless these sites are consumed by the binder during the binder crosslinking/polymerization reaction, or in post-cure or pre-cure treatments deliberately designed to scavenge them. The interior surface area of a typical silicalite is 350 meters squared per gram, and does not depend on crystal size, while the exterior surface area varies strongly with crystal size and is about 100 meters squared per gram for 200 Å crystals.

The presence of the nanocrystallites imparts superior mechanical stability to the films as compared with xerogels which have no long range order. In addition, the rigid crystals prevent shrinkage of the film as the solvent is removed during the bake and cure drying steps, as opposed to xerogels which can experience significant shrinkage on evaporative drying necessitating complicated procedures to mitigate the shrinkage. The silicalite/binder porous material is applied to semiconductor substrates using spin-on processes that are conventional in semiconductor fabrication. The crystals are grown externally and then applied to the substrate. In contrast, growing polycrystalline silicalite films in situ is inconsistent with the throughput requirements of semiconductor device fabrication and does not produce films with the interparticle porosity of the present silicalite/binder material.

Figure 2A:
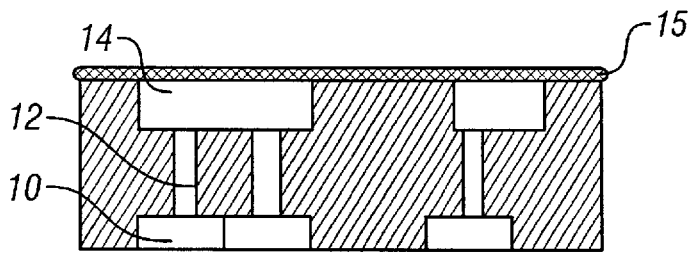
FIGS. 2a–2h are schematic representations of a dual damascene process of fabricating structures with copper interconnects, in which the present invention can be incorporated.
Figure 2B:
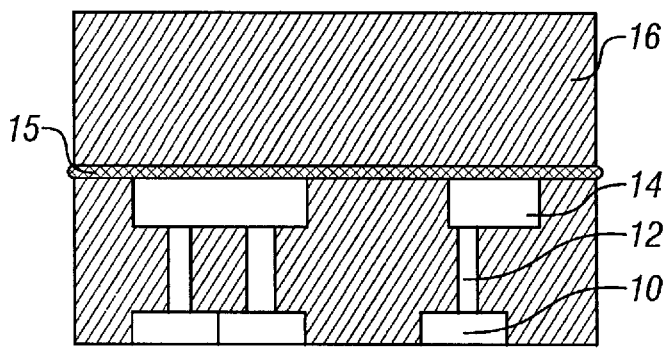

Use of the silicalite/binder porous material as an insulating layer is readily integrated into standard processes for producing multilayer integrated circuit devices. For example, a dual damascene process for fabricating structures with copper interconnects is illustrated schematically in FIGS. 2a–2h. A first metal layer with devices 10, metal contacts 12, typically, tungsten, and copper conductor 14 is shown in FIG. 2a. A thin layer of silicon nitride or silicon oxynitride or silicon carbide 15 serves as an etch stop layer and barrier against diffusion of copper between metal levels. Insulating layer 16 is deposited over the silicon nitride layer 15, as shown in FIG. 2b. The silicalite/binder porous material, according to the present invention, is used as insulating layer 16. Conventionally, insulating layer 16 is an oxide layer. Because the silicalite/binder material is completely or largely composed of silica, it will respond to the same etch chemistries as a conventional oxide. Therefore, incorporating the silicalite/binder material does not require additional equipment or process steps.

Figure 2C:
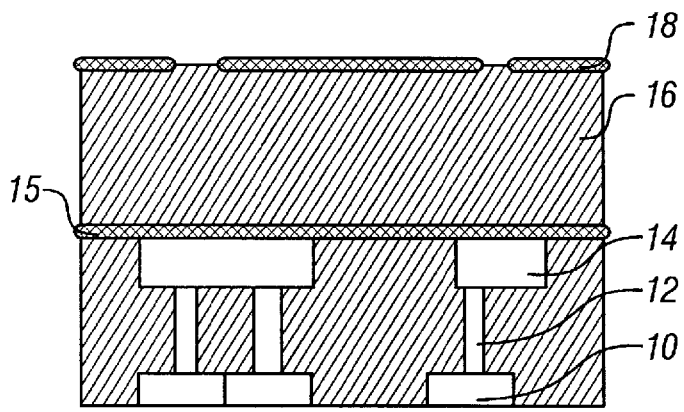
Figure 2D:
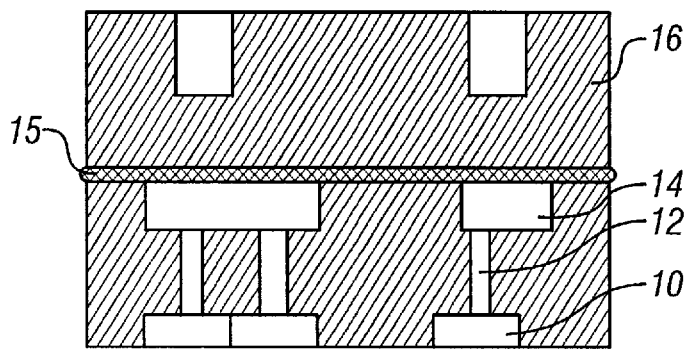
Figure 2E:
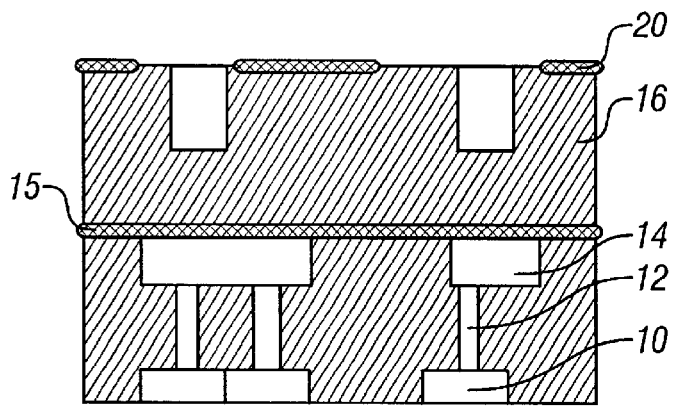
Figure 2F:
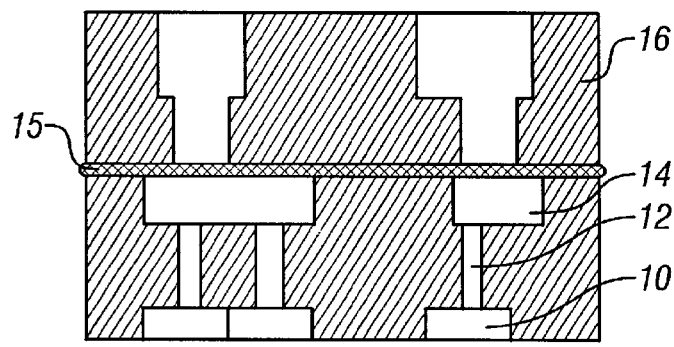

A photoresist layer 18 is deposited over silicalite/binder layer 16 and patterned for the vias (FIG. 2c), followed by a via etch through layer 16 (FIG. 2d). In FIG. 2c a thick insulating layer 16 is shown which will ultimately accommodate both the via and trench levels. Alternatively, the via and trench levels are separated by an etch stop layer, which may be a low dielectric constant material with high etch selectivity to the insulating material of via and trench levels, in which case the via etch chemistry would have to be altered when the emerging via strikes the etch stop layer. The silicalite/binder porous material is also readily used for the via and trench level insulating material in a process that includes an etch stop layer. The remainder of the dual damascene process includes depositing a second photoresist layer 20 and patterning it for the trenches (FIG. 2e) followed by a trench etch (FIG. 2f). The trenches and vias are typically lined with a liner metal 22 (FIG. 2g), filled with copper 24, and planarized by chemical mechanical polishing to produce the structure of FIG. 2h. Although a two-layer structure is shown in the above example, the silicalite/binder porous material may be used as the insulating layer for any layer of a multilevel device.

When a silica precursor such as TEOS or TMOS is used as the binder precursor, the silicalite/binder material has the same chemical composition as silica. In this case, the silicalite/binder can be used together with an organic low dielectric constant (low k) insulator to produce a low k structure which does not include a higher k embedded etch stop, but still allows a sharp etch definition between trench and via levels. An organic low k dielectric is used in the via level, i.e. the lower half of the film 16, and silicalite/binder is deposited directly onto the organic low k film to form the trench level. After patterning the via level, an etch chemistry which does not attack photoresist but readily attacks oxide is used to imprint the via pattern through the silicalite/binder. Then the etch chemistry is switched to one which readily attacks polymeric films, which will remove most of the photoresist, but also continue the trench etch through the organic low k layer through the vias opened in the silicalite/binder. This has the advantage of allowing tightly-controlled via etch, despite the low etch selectivity between polymeric low k films and photoresist. Afterwards, the trench pattern is etched into the silicalite as described in the previous paragraph.

Figure 3A:
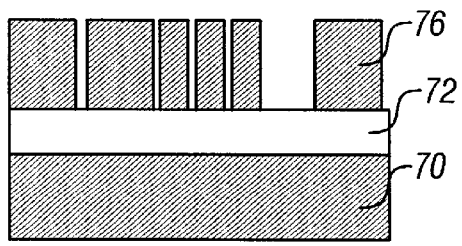
FIGS. 3a–3f are schematic representations of a subtractive aluminum process of fabricating devices, in which the present invention can be incorporated.
Figure 3B:
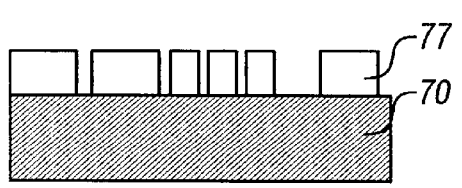
Figure 3C:
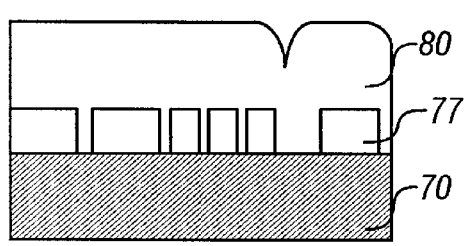
Figure 3D:
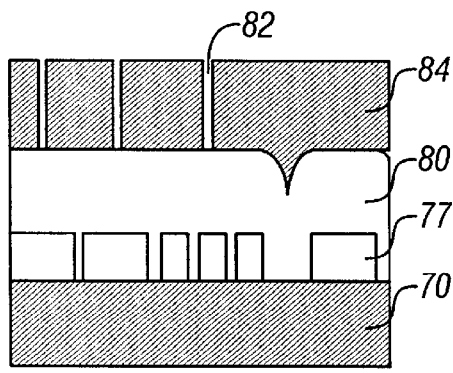
Figure 3E:
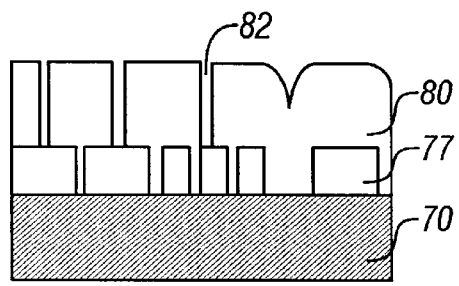
Figure 3F:
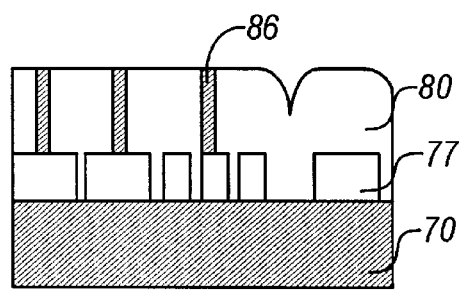

The present invention may also be integrated with standard aluminum processing schemes. In a typical scheme, shown schematically in FIGS. 3a–3f, a sheet of aluminum 72 is deposited across a substrate 70, and then a thin layer of photoresist 76 is applied to the aluminum. The photoresist 76 is patterned (FIG. 3a) and the aluminum etched in an evacuated chamber, resulting in aluminum wires 77 in the areas protected by photoresist (FIG. 3b.) A dielectric insulating layer 80 is then deposited on the patterned aluminum, where it both fills the spaces between lines and builds up above the lines (FIG. 3c.) The silicalite/binder porous material according to the present invention is used as insulating layer 80. Optionally, insulating layer 80 may be capped with CVD silicon dioxide, and optionally may be polished back to form a planar layer (not shown). Vias 82 are then patterned in a photoresist layer 84 (FIG. 3d) and etched through the cap oxide, if present, and insulating material 80 (FIG. 3e.) The etched vias are then filled with metal 86 (FIG. 3f) to electrically connect the aluminum lines to the next level of aluminum lines.

Optionally, the silicalite/binder material used in damascene processing of copper interconnects can contain a very small percentage of aluminum. During the damascene process sequence, an electrical bias may be generated between adjacent copper lines which could lead to migration of copper ions through the silicalite/binder film. Aluminum serves as an efficient getter for drifting copper ions. However, aluminum, in sufficient concentration, has the undesirable property of making the crystals hydrophilic. Therefore, a very small concentration of aluminum atoms, on the order of about 1 part in 10,000 and in any event less than about 1 part in 1,000, is optionally included in the silicalite crystal framework to reduce copper ion drift. This would also prevent copper from drifting into the transistor region, where it would substantially decrease the lifetime of the device. The aluminum-containing silicalite nanocrystals are produced by including a very small concentration of aluminum precursor along with the silica source, in the silicalite synthesis.

Before applying the silicalite/binder material over silicon nitride layer 15, as in the damascene process described above, or alternatively, over a silicon substrate, the silicon nitride or silicon may optionally be pretreated with a wetting agent, in particular, with hexamethyldisilazane (HMDS), hexaphenyldisilazane (HPDS) or dichlorodimethylsilane (DCMS). In a typical process, a wafer surface is exposed to a HMDS vapor for a period of up to 60 seconds at a temperature between about 150° C. and about 300° C. The surface created on the wafer from the exposure provides spontaneous wetting of the surface by the silicalite slurry and also improves adhesion of the final silicalite/binder porous film to the surface. In addition, the silicalite/binder film may be exposed to an agent such as HMDS, HPDS, or DCMS after the cure to make the film more hydrophobic and to improve adhesion of the film to the next layer above it in a multilayer device.

Figure 2G:
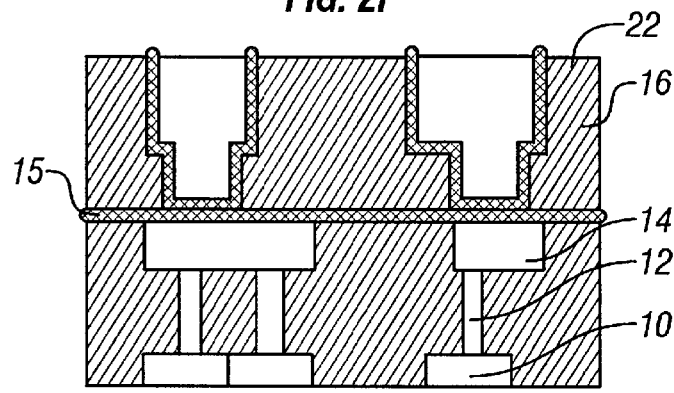
Figure 2H:
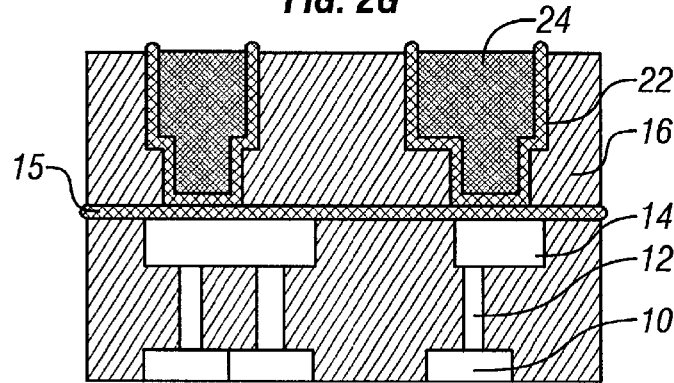

In an additional, optional step in the damascene process using a silicalite/binder insulating layer, the etched silicalite/binder layer 16 as shown in FIG. 2f may optionally be exposed to liquid or vapor mercaptopropyltrimethylsiloxane (MPS) before deposition of the liner metal 22 in FIG. 2g. The MPS exposure enhances adhesion of the silicalite/binder material to the metal liner by covering the silicalite/binder film with mercapto groups, which are known to form strong bonds to metal. The MPS may be applied by vapor exposure or by dipping, or spin coating a liquid form. The MPS may, optionally, be diluted in a solvent, for example, ethanol. A dilute organic acid, such as acetic acid, may be included to enhance the rate of MPS reaction with the silicalite/binder film. Unreacted MPS, acid, and diluent are removed with deionized water.

Thus, it may be seen that the material composed of silicalite nanocrystals in a porous amorphous binder provides a useful insulating layer for integrated circuit devices that is readily integrated into standard fabrication processes. Although the invention has been described with reference to particular examples, the description is only an example of the invention's application and should not be taken as a limitation. Various adaptations and combinations of features of the examples disclosed are within the scope of the invention as defined by the claims following the chemical data below.

EXAMPLE 1

"Pseudosilicalite/binder" material was prepared according to the methods of the present invention using amorphous silica particles in place of silicalite nanocrystals. In this example, 27% hydrolyzed TEOS in ethanol, with a trace of acidic water, constituted the binder solution. Solutions of 2.5% to 10% binder solution in the colloidal silica were used. Control samples were fabricated with no binder, to form a basis of comparison. The silica colloidal suspension contained about 20 weight percent 200 Å silica particles in a solution of about 50% ethanol and 50% propyl propylene glycol, and was substantially nonalkaline, with a pH between 7 and 8. These particle/binder solutions were spin-coated according to standard industry practices. The films were then placed on a hotplate in an ambient atmosphere at 200° C. for five minutes, followed by a high temperature cure on a hotplate at 400° C. in an atmosphere of about 10 ppm oxygen, with the balance nitrogen. Values for thickness uniformity, refractive index (from which porosity can be determined), and stud pull strength are shown in Table 1 for the various concentrations of binder used in this study.

TABLE 1

Properties of "Pseudosilicalite/binder"

| | Pseudo-silicalite 6.5% binder | Pseudo-silicalite 3.25% binder | Pseudo-silicalite 1.5% binder | Pseudo-silicalite No binder |
|---|---|---|---|---|
| Thickness Uniformity | 1.1% | 0.65% | 0.79% | 1.5% |
| Refractive Index | 1.35 | 1.28 | 1.23 | 1.19 |
| Porosity | ~14% | ~32% | ~44% | ~54% |
| Stud Pull Strength | 39 MPa | 16 MPa | 7.7 MPa | Too low to measure |

EXAMPLE 2

Fully dense polycrystalline silicalite films grown in situ were tested to provide an upper limit on strength, adhesion, and dielectric constant for silicalite/binder material. The dense polycrystalline films were provided by T. Bein and S. Mintova, grown according to the descriptions in the literature (Sterte et. al. supra or Mintova et.al.Microporous Materials 11, 149 (1997)). About a half a monolayer of small silicalite "seed crystals" were placed on a silicon wafer in contact with the mother liquor for growing silicalite. The seed crystals grew upwards and fully occupied the space between them, forming a thick, rough polycrystalline film, about 5000 Å thick.

For the stud pull measurements, using the process described above, the films were capped with aluminum to prevent epoxy from being forced through the film. In the two tests conducted, the silicon substrate shattered while leaving the film still firmly attached to the wafer. The forces at which the silicon shattered in the two tests were 35 MPa and 51 MPa. Thus it is reasonable to conclude that the adhesive/cohesive strength of these films is at least 51 MPa.

Dielectric constant measurements were carried out by sputtering ~5000 Å thick aluminum onto small chips of the fully dense polycrystalline film. The area of the chips, were measured with a reticule under a microscope, the capacitance was measured with a standard Keithley LCM meter and the thickness was measured by cross section SEM. Twelve points were measured and the average taken for thickness measurements. The two samples tested showed dielectric constants of 2.72 and 2.96, for an average of 2.84.

I claim:

1. An integrated circuit device comprising one or more dielectric layers, wherein at least one of said one or more dielectric layers comprises silicalite crystals.

2. The integrated circuit device of claim 1 wherein said at least one of said one or more dielectric layers further comprises a porous binder material.

3. The integrated circuit device of claim 2 wherein said porous binder material comprises amorphous silica.

4. The integrated circuit device of claim 2 wherein said porous binder material comprises a siloxane polymer or an organic polymer.

5. The integrated circuit device of claim 2 wherein said at least one of said one or more dielectric layers has a porosity of at least about 50%.

6. The integrated circuit device of claim 2 wherein said at least one of said one or more dielectric layers has a dielectric constant less than about 2.6.

7. The integrated circuit device of claim 2 wherein said integrated circuit device has features having a critical dimension, and wherein an average size of a longest axis of said silicalite crystals is no greater than about 20% of said critical dimension.

8. The integrated circuit device of claim 7 wherein no more than a negligible number of said silicalite crystals have a longest axis greater than about 40% of said critical dimension.

9. The integrated circuit device of claim 8 wherein said average size of a longest axis of the silicalite crystals is no greater than about 200 Angstroms.

10. The integrated circuit device of claim 2 wherein said silicalite crystals comprise a concentration of aluminum atoms between about 1 part in 10,000 and 1 part in 1,000.

11. A method of making a porous insulating layer as part of an integrated circuit device, the method comprising:

depositing a binder precursor and a slurry comprising silicalite crystals and one or more solvents on a substrate; and heating the substrate wherein the binder precursor forms a porous solid material containing silicalite crystals.

12. The method of claim 11 wherein the integrated circuit device has features of a critical dimension and wherein an average size of a longest axis of the silicalite crystals is no greater than about 20% of the critical dimension.

13. The method of claim 12 wherein no more than a negligible number of the silicalite crystals have the longest axis greater than about 40% of the critical dimension.

14. The method of claim 11 wherein the slurry comprises the binder precursor.

15. The method of claim 11 wherein the binder precursor is mixed with the slurry immediately before the slurry is deposited on the substrate.

16. The method of claim 11 wherein the binder precursor is in a binder precursor solution and the slurry and the binder precursor solution are deposited separately on the substrate.

17. The method of claim 11 wherein the slurry is a colloidal suspension.

18. The method of claim 11 wherein the binder precursor is selected from the group consisting of tetraethoxysilane, tetramethoxysilane, hydridosilsesquioxane, methylsilsesquioxane, poly(arylene ether) polymers and benzocyclobutene polymers.

19. The method of claim 11 further comprising exposing the solid porous material containing silicalite crystals to an agent selected from the group consisting of hexamethyldisilazane, hexaphenyldisilazane, and dichlorodimethylsilane.

* * * * *